United States Patent
Kim et al.

(10) Patent No.: US 6,921,919 B2
(45) Date of Patent: Jul. 26, 2005

(54) SEMICONDUCTOR DEVICE AND METHOD OF FORMING THE SAME

(75) Inventors: Ji-Young Kim, Gyeonggi-do (KR); Sang-Yong Kim, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/633,048

(22) Filed: Jul. 31, 2003

(65) Prior Publication Data

US 2004/0061189 A1 Apr. 1, 2004

(30) Foreign Application Priority Data

Oct. 1, 2002 (KR) ................................ 10-2002-0059835

(51) Int. Cl.[7] ........................ H01L 29/04; H01L 31/036
(52) U.S. Cl. ........................................ 257/72; 257/202
(58) Field of Search ................................ 257/72, 202

(56) References Cited

U.S. PATENT DOCUMENTS

2003/0202134 A1 * 10/2003 Kim ............................ 349/43

FOREIGN PATENT DOCUMENTS

| KR | 010017499 | 3/2001 |
|---|---|---|
| KR | 010037477 | 5/2001 |
| KR | 010058477 | 7/2001 |

OTHER PUBLICATIONS

English Language of Abstract for Korean Patent Publication No. 010017499.
English Language of Abstract for Korean Patent Publication No. 010037477.
English Language of Abstract for Korean Patent Publication No. 010058477.

* cited by examiner

*Primary Examiner*—Long Pham
(74) *Attorney, Agent, or Firm*—Marger Johnson & McCollom, P.C.

(57) ABSTRACT

A semiconductor device protecting the ends of a gate line and a method of forming the same are disclosed. The semiconductor device includes a semiconductor substrate, a gate line crossing over the semiconductor substrate, and a protecting pattern covering ends of the gate line. According to the method, a gate line is formed at a semiconductor substrate. A spacer is formed to cover sidewalls of the gate line. A protecting pattern is formed to cover the ends of the gate line. The protecting pattern may be formed of silicon nitride or silicon oxide. Since the protecting pattern protects ends of a gate line, it is possible to prevent gate electrodes from being damaged by a cleaning solution such as SC1 in a subsequent process.

5 Claims, 10 Drawing Sheets

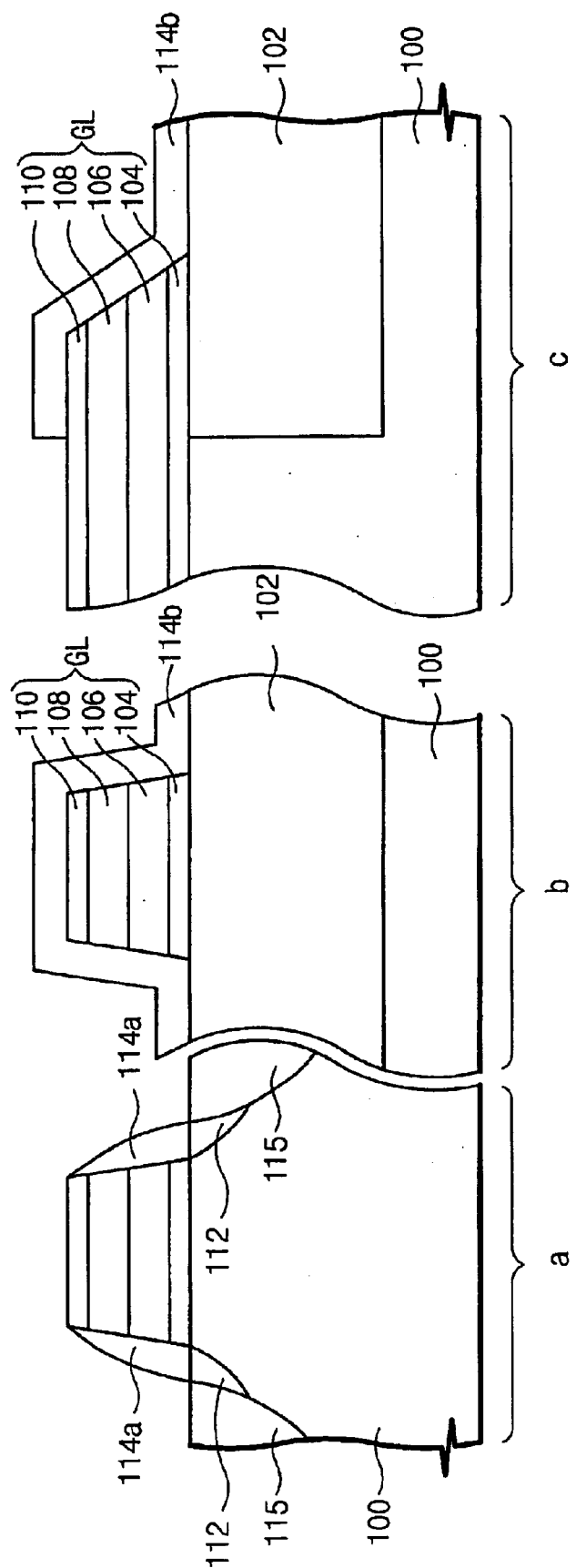

SEMICONDUCTOR DEVICE AND METHOD OF FORMING THE SAME

CROSS REFERENCE TO RELATED APPLICATIONS

This application claims priority from Korean Patent Application No. 2002-59835, filed on Oct. 1, 2002, the contents of which are hereby incorporated by reference in their entirety for all purposes.

BACKGROUND OF THE INVENTION

1. Technical Field of the Invention

This disclosure generally relates to a semiconductor device and a method of forming the same and in particular, to a structure of a semiconductor device that protects an end of a gate line and a method of forming the same.

2. Background of the Invention

During a photo-lithography process, one of the many processes used to form a semiconductor device, the end parts of photoresist patterns become rounded due to proximity effects. As semiconductor devices become highly integrated, the pattern size is reduced and proximity effects become increasingly problematic.

FIG. 1A is a plan diagram illustrating a semiconductor device including a gate line in accordance with the conventional technology.

FIG. 1B contains cross-sectional diagrams taken along the line I–I' and the line II–II' respectively, of the semiconductor device of FIG. 1A. In FIG. 1B, the letter 'aa' indicates a region 1 that is a cross-sectional diagram taken along the I–I' line of FIG. 1A, and the letter 'bb' indicates a region 2 that is a cross-sectional diagram taken along the II–II' line of FIG. 1A.

Referring to FIGS. 1A and 1B, a field oxide (FOX) 3 is formed at a semiconductor substrate 1 to define an active region (AR). A gate oxide layer 5, a polysilicon layer 7, a tungsten layer 9, and a capping layer 11 are sequentially stacked on an entire surface of the semiconductor substrate 1. The layers 11, 9, 7 and 5 are sequentially patterned to form a gate line (GL). In a photolithography process prior to the patterning process, end parts of a photo mask (M) are orthogonal. However a plan view of the end (E) of the gate line that is subsequently formed becomes rounded as illustrated in FIG. 1A and a side view thereof becomes gently sloped as illustrated in FIG. 1B. A low-concentration impurity-doped region 4 is formed by using the gate line (GL) as an ion-implantation mask. In order to form an lightly doped drain, an insulation layer is stacked on an entire surface of the semiconductor substrate 1 and anisotropically etched to form a spacer 13 covering sidewalls of the gate line (GL). Next, a high concentration impurity-doped region 14 is formed by using the gate line (GL) and the spacer 13 as ion-implantation masks. At this time, since the side slope of the end (E) of the gate line (GL) is gentle, almost all of the insulation layer is removed to form a very thin and imperfect spacer 13 at the region 2 (bb). When a subsequent cleaning process is performed using an SC1 solution that is frequently used in a cleaning process and made of a mixture of $NH_4OH$, $H_2O_2$ and deionized water, the SC1 penetrates the end (E) of the gate line (GL) that is weak with the thin spacer 13, thereby dissolving the tungsten layer 9. This results in reliability problems for the semiconductor device.

Embodiments of the invention address these and other disadvantages of the prior art.

SUMMARY OF THE INVENTION

Embodiments of the invention provide structures of a semiconductor substrate that protect an end of a gate line in order to improve reliability of a semiconductor device. Embodiments of the invention also provide methods of forming the same structures.

BRIEF DESCRIPTION OF THE DRAWINGS

FIG. 3 contains three cross-sectional diagrams of the semiconductor device shown in FIG. 2, taken along the line III–III', the line IV–IV', and the line V–V', respectively.

DETAILED DESCRIPTION OF THE INVENTION

Figure 1A:
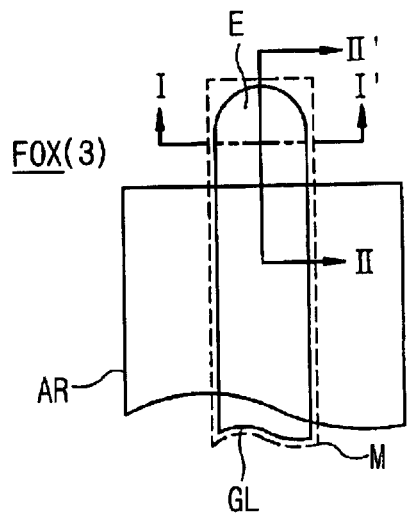
FIG. 1A is a plan diagram illustrating a semiconductor device including a gate line in accordance with a conventional technology.
Figure 1B:
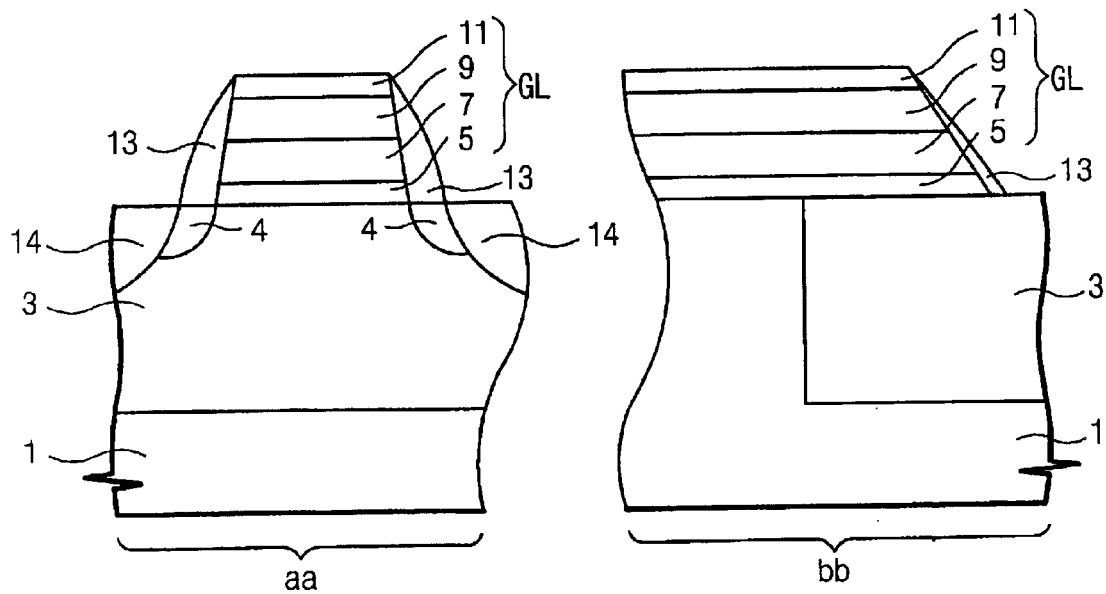
FIG. 1B contains two cross-sectional diagrams taken along the line I–I' and the line II–II', respectively, of the semiconductor device illustrated in FIG. 1A.

The invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present.

Furthermore, relative terms, such as "beneath", may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as "below" other elements would then be oriented "above" the other elements. The exemplary term "below", can therefore, encompasses both an orientation of above and below.

It will be understood that although the terms first and second are used herein to describe various regions, layers and/or sections, these regions, layers, and/or sections should not be limited by these terms. These terms are only used to distinguish one region, layer, or section from another region, layer, or section. Thus, a first region, layer or section discussed below could alternatively be termed a second region, layer or section, and similarly, a second region, layer, or section could be termed a first region, layer, or section without departing from the teachings of the invention. Like numbers refer to like elements throughout. In FIGS. 3, 4A–4C, 5 and 6A–6C, the letter 'a' indicates a first region that is a cross-sectional diagram taken along the III–III' line of FIG. 2, the letter 'b' indicates a second region that is a cross-sectional diagram taken along the IV–IV' line thereof, and the letter 'c' indicates a third region that is a cross-sectional diagram taken along the V–V' line thereof.

Figure 2:
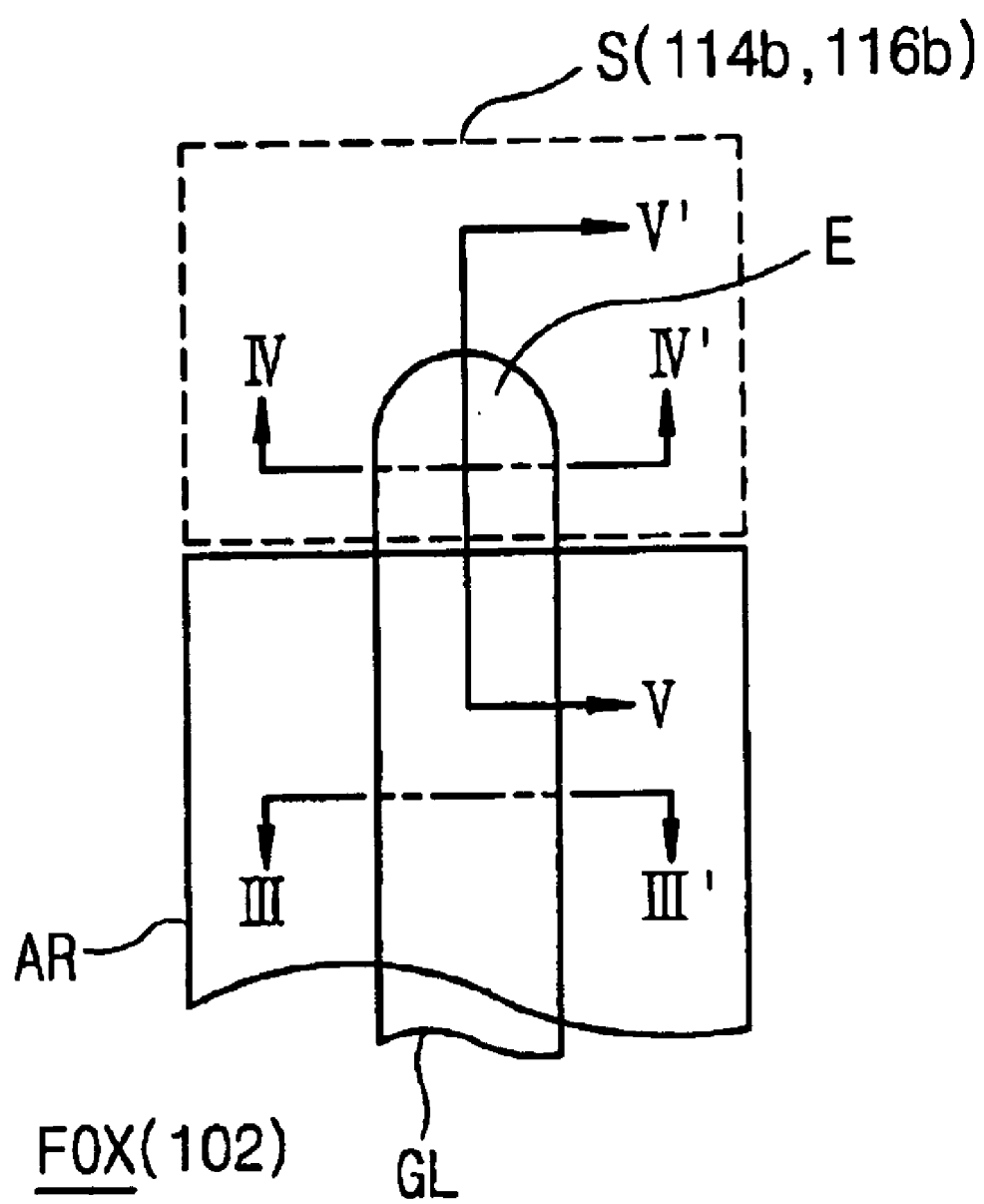
FIG. 2 is a plan diagram illustrating a semiconductor device in accordance with an embodiment of the invention.

FIG. 2 is a plan diagram illustrating a semiconductor device in accordance with an embodiment of the invention, while FIG. 3 contains three cross-sectional diagrams of the semiconductor device shown in FIG. 2, taken along the line III–III', the line IV–IV', and the line V–V', respectively.

Referring to FIGS. 2 and 3, a field oxide (FOX) 102 is present at a semiconductor substrate 100 to define an active region (AR). A gate line (GL) crosses over the active region (AR). The gate line (GL) is composed of a gate oxide layer 104, a polysilicon layer 106, a tungsten layer 108, and a capping layer pattern 110 that are sequentially stacked. At this time, the gate oxide layer 104 may have a thickness of about 50~300 Å, and the poly silicon layer 106 may have a thickness of about 700~900 Å. The thickness of the tungsten layer 108 may be about 400~600 Å, and that of the capping layer 110 may be 1900~2100 Å. A spacer 114a covers sidewalls of the gate line (GL). In the active region (AR), there is a low concentration impurity-doped region 112 to contact with side lower ends of the gate line (GL) and a high concentration impurity-doped region 115 to contact with those of the spacer 114a. The end (E) is located on the field oxide 102 and covered by a protecting pattern (S) 114b. The spacer 114a and the protecting pattern (S) 114b are formed of the same material and preferably of silicon nitride or silicon oxide. The protecting pattern (S) 114b may have a thickness of 400~600 Å.

Figure 4A:
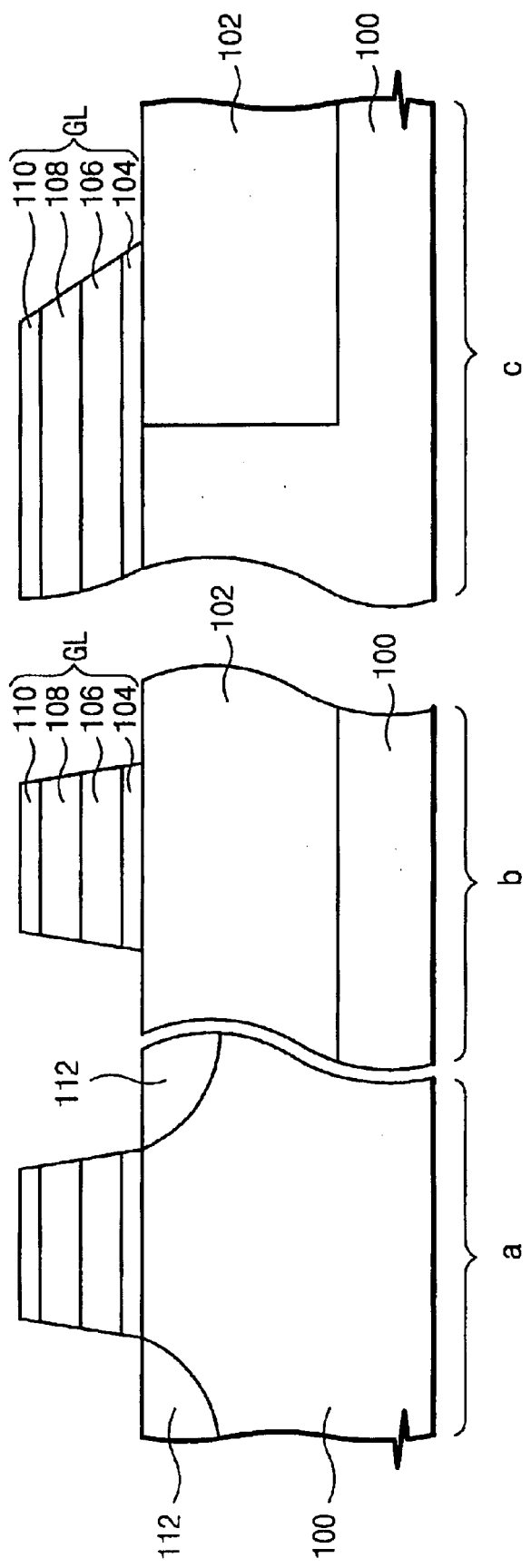
FIGS. 4A through 4C are cross-sectional diagrams illustrating a method of forming the structure of FIG. 3.
Figure 4B:
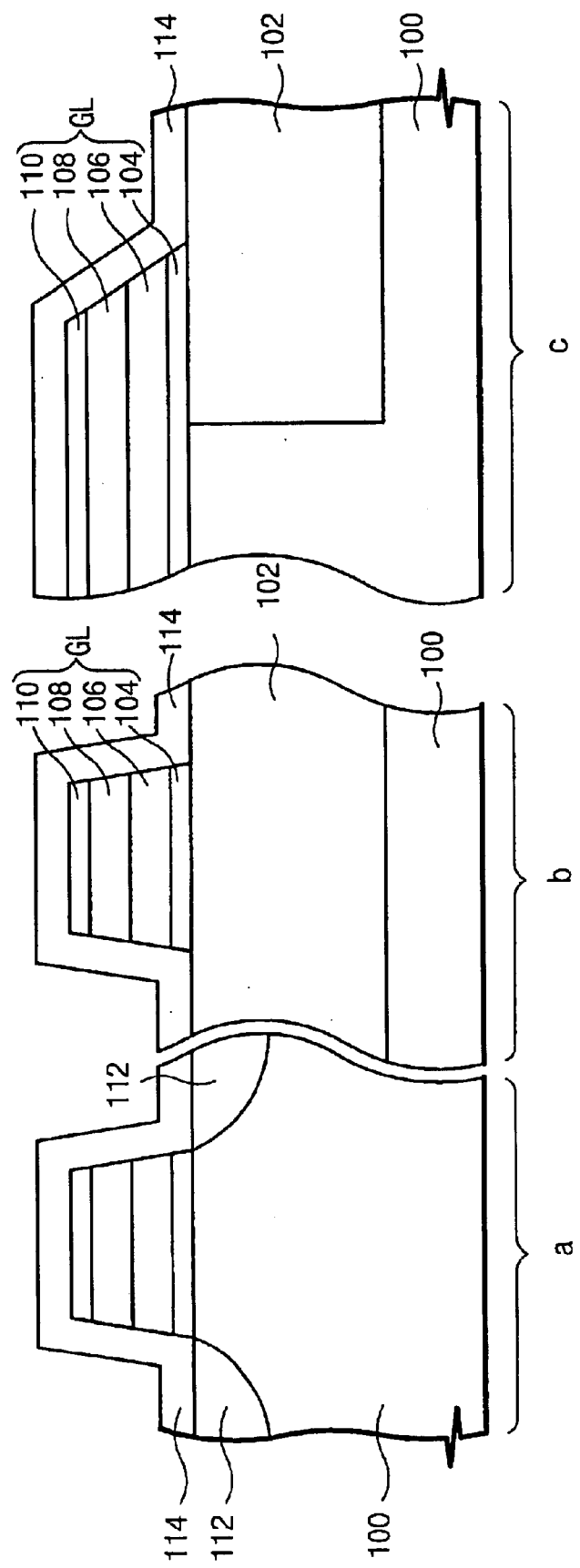
Figure 4C:
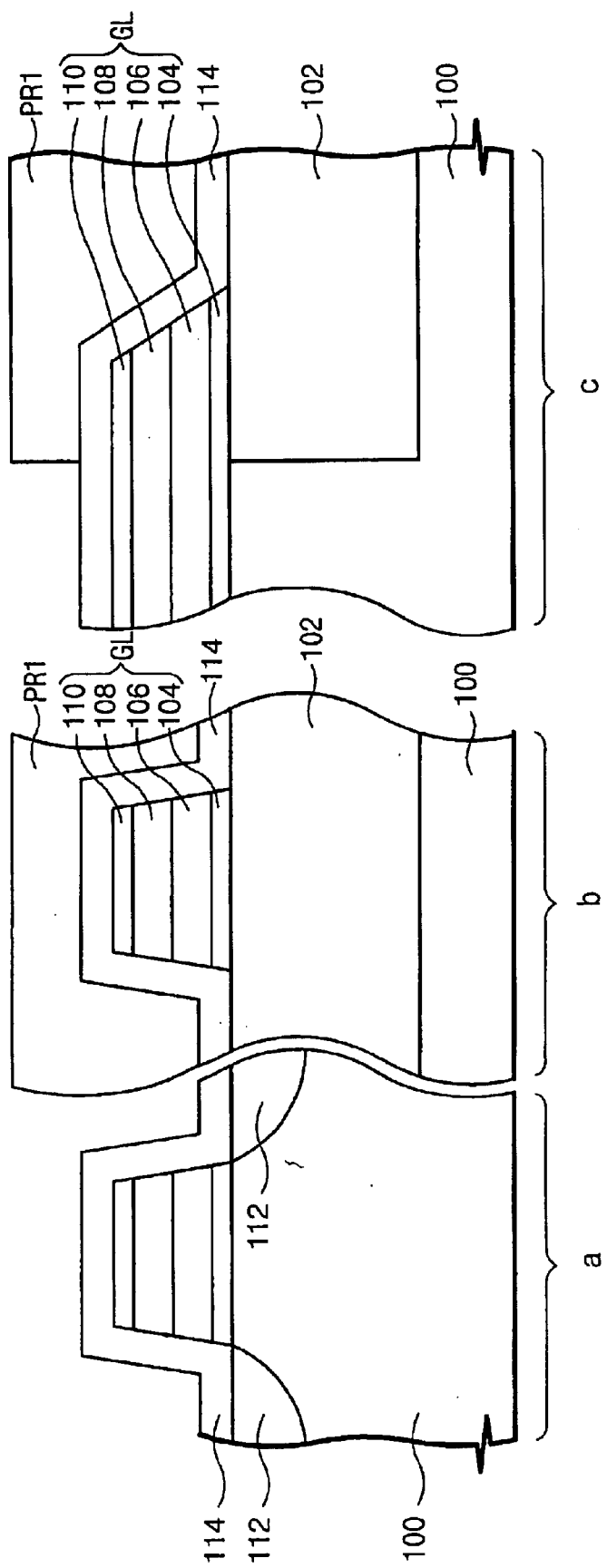

FIGS. 4A through 4C are cross-sectional diagrams illustrating a method of forming the structure of FIG. 3.

Referring to FIG. 4A, a field oxide (FOX) 102 is formed on a semiconductor substrate 100 to define an active region (AR). A gate oxide layer 104, a polysilicon layer 106, a tungsten layer 108, and a capping layer 110 are sequentially stacked at an entire surface of the semiconductor substrate 100. The capping layer 110 may be formed of silicon nitride. The layers 110, 108, 106, and 104 are sequentially patterned to form a gate line (GL). A low concentration impurity-doped region 112 is formed in the active region (AR) by using the gate line (GL) as an ion-implantation mask.

Referring to FIGS. 4B and 4C, an insulation layer 114 is conformally stacked over an entire surface of the semiconductor substrate 100. The insulation layer 114 may be formed of silicon nitride or silicon oxide. A photoresist pattern (PR1) is formed to cover only the end (E) of the gate line (GL). The insulation layer 114 is anisotropically etched by using the photoresist pattern (PR1). Thus, as illustrated in FIG. 3, a spacer 114a is formed to cover sidewalls of the gate line (GL) and, simultaneously, a protecting pattern (S) 114b is formed to cover the end (E) of the gate line (GL). The photoresist pattern (PR1) is removed. A high concentration impurity-doped region 115 is formed in the active region (AR) of the semiconductor substrate 100 by using the gate line (GL), the spacer 114a and the protecting pattern 114b as ion-implantation masks.

According to this embodiment of the invention, since the protecting pattern (S) 114b protects the end (E) of the gate line (GL), it is possible to prevent the tungsten from being damaged by a cleaning solution such as SC1.

Figure 5:
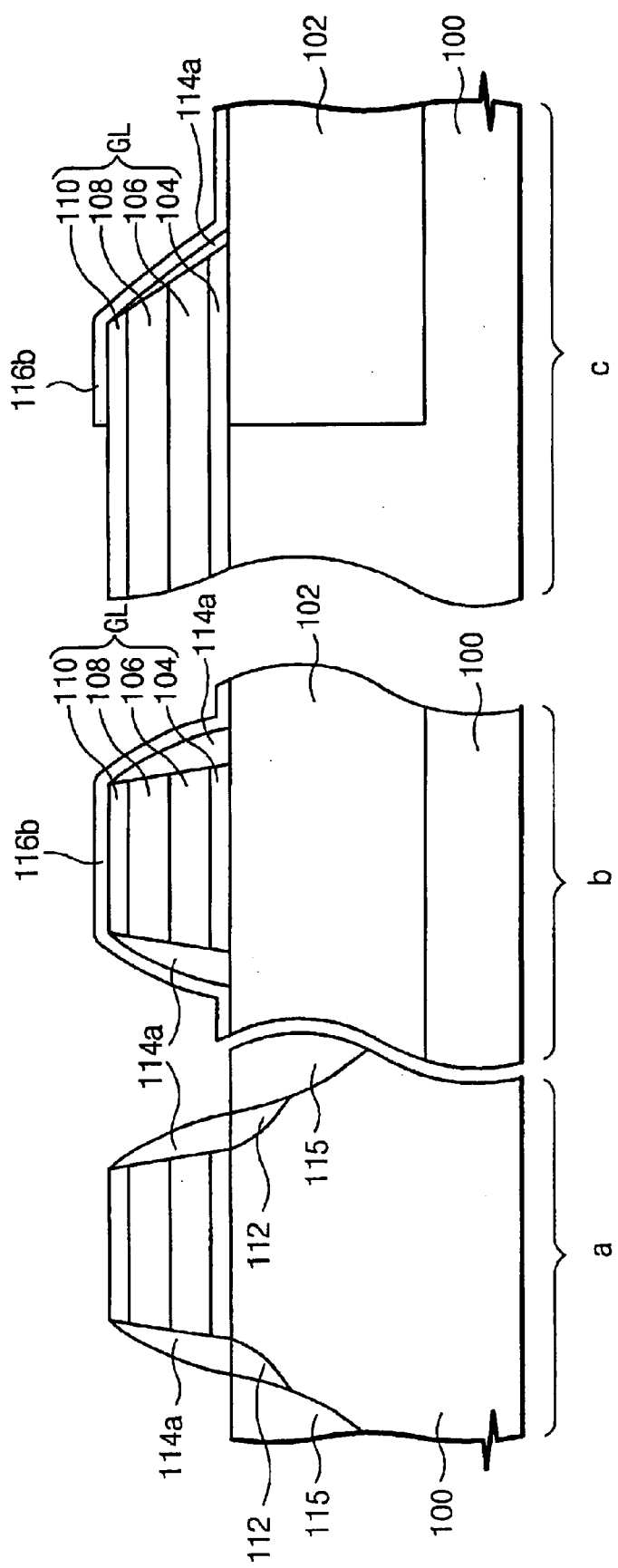
FIG. 5 contains three cross-sectional diagrams of the semiconductor device shown in FIG. 2, taken along the line III–III', the line IV–IV', and the line V–V', respectively, but in accordance with another embodiment of the invention.

FIG. 5 contains three cross-sectional diagrams of the semiconductor device shown in FIG. 2, taken along the line III–III', the line IV–IV', and the line V–V', respectively, but in accordance with another embodiment of the invention.

Referring to FIGS. 2 and 5, a semiconductor device includes a spacer 114a covering sidewalls and ends (E) of a gate line (GL) and a protecting pattern (S) 116b covering the ends (E) of the gate line (GL). At this time, the spacer 114a is interposed between the gate line (GL) and the protecting pattern (S) 116b at the end (E) of the gate line (GL). The protecting pattern (S) 116b may be thinner than the protecting pattern (S) 114b of the embodiment of FIG. 3 and preferably may have a thickness of that is about one fifth the thickness of the protecting pattern (S) 114b. The protecting pattern (S) 116b may have a thickness of 80~120 Å.

Figure 6A:
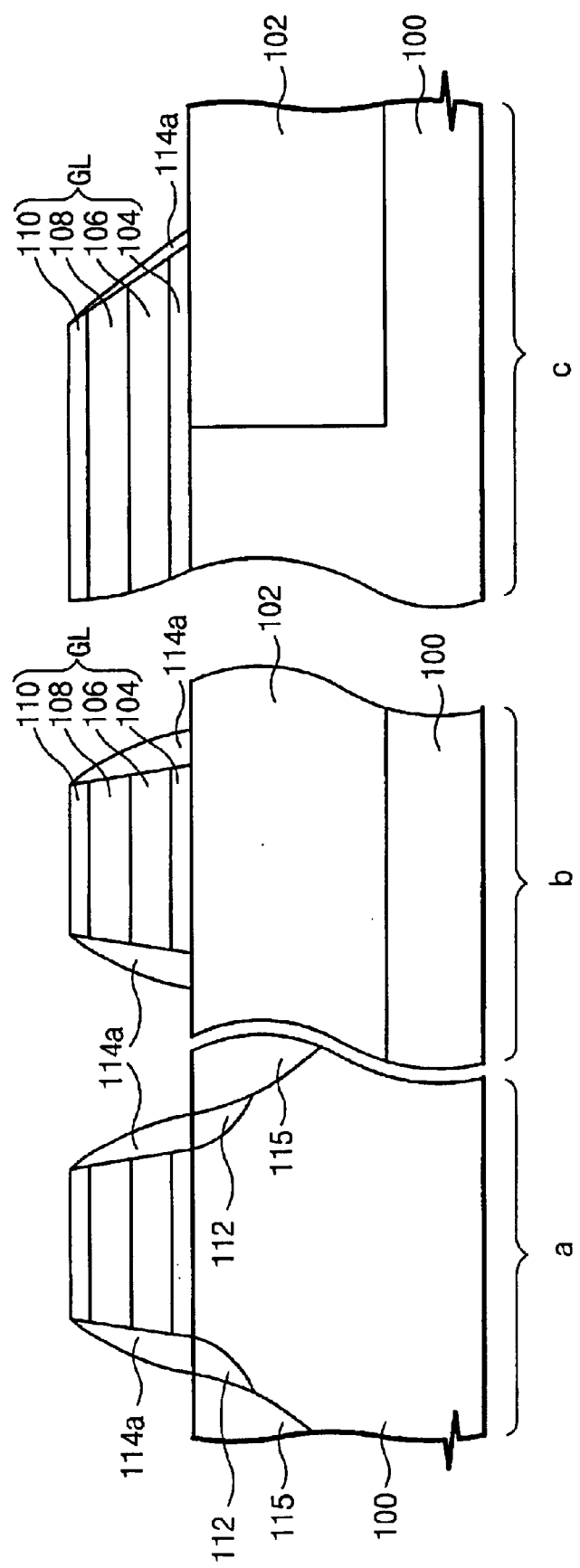
FIGS. 6A through 6C are cross-sectional diagrams illustrating a method of forming the structure of FIG. 5.
Figure 6B:
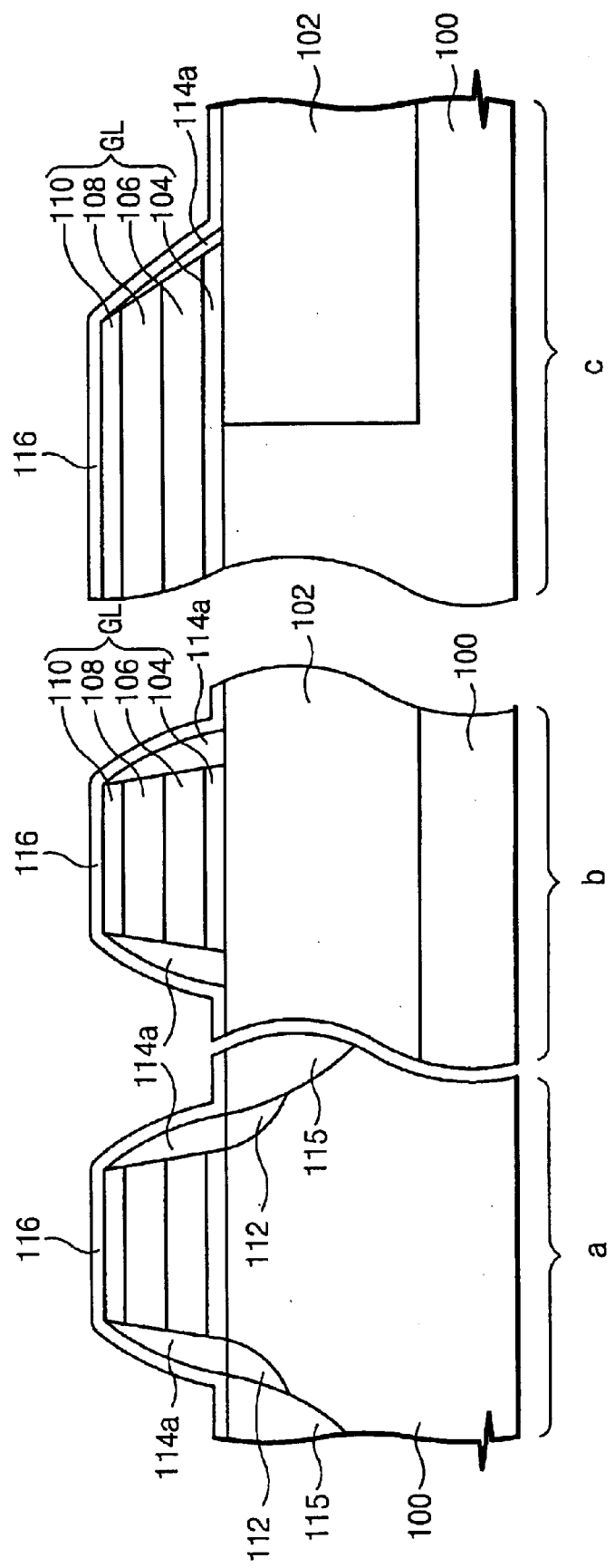
Figure 6C:
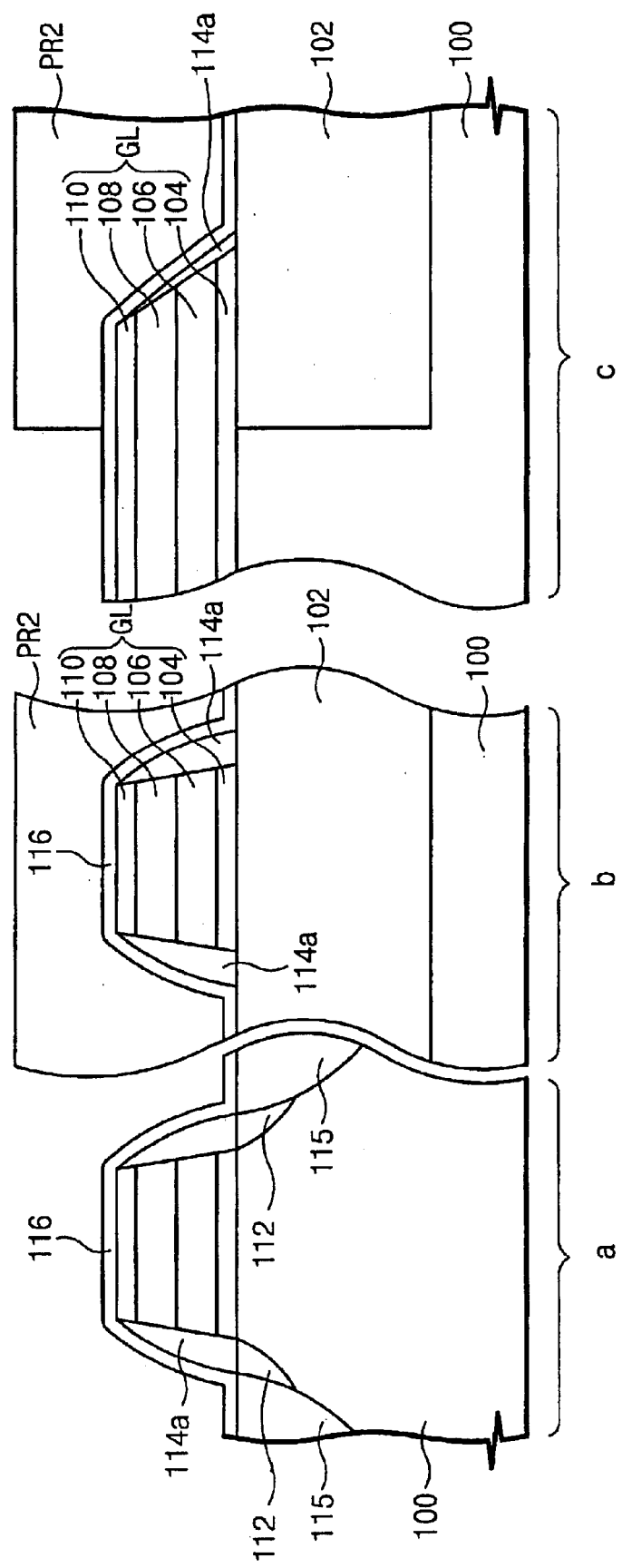

FIGS. 6A through 6C are cross-sectional diagrams illustrating a method of forming the structure of FIG. 5.

Referring to FIGS. 6A through 6C, an insulation layer 114 is entirely anisotropically etched at the state of FIG. 4B of the first embodiment, thereby forming a spacer 114a covering sidewalls and ends (E) of the gate line (GL). A high concentration impurity-doped region 115 is formed in an active region (AR) of the semiconductor substrate 100 by using the gate line (GL) and the spacer 114a as ion-implantation masks. A protecting layer 116 is stacked on an entire surface of the semiconductor substrate 100. At this time, the protecting layer 116 may be formed of the same material with the insulation layer 114. The protecting layer 116 may be formed in a thickness that is approximately one fifth the thickness of the insulation layer 114, and preferably is a thickness of 80~120 Å. A photoresist pattern (PR2) is formed on the protecting layer 116 to cover the ends (E) of the gate line (GL). An anisotropic etch process is performed with respect to the protecting layer 116 by using the photoresist pattern (PR2) as an etch mask, thereby forming a protecting pattern (S) 116b covering the ends (E) of the gate line (GL) but exposing the gate line (GL) on the active region (AR). The photoresist pattern (PR2) is removed. Except for the thickness of the protecting layer 116, the process conditions and other layers are identical to the embodiment illustrated in FIG. 3.

Embodiments of the invention will now be described in a non-limiting way.

Embodiments of the invention may include a semiconductor substrate, a gate line crossing over the semiconductor substrate, and a protecting pattern covering ends of the gate line. The protecting pattern may be formed of silicon nitride or silicon oxide.

Embodiments may further include a spacer covering sidewalls of the gate line and being interposed between the gate line and the protecting pattern at the ends of the gate line. The spacer may be formed of silicon nitride or silicon oxide. The gate line includes an oxide pattern and a conductive pattern that are sequentially stacked on the semiconductor substrate. The conductive pattern is formed of a metal selected from a group consisting of tungsten, aluminum and aluminum.

In accordance with an embodiment of the invention, the semiconductor device may be formed by the following method. First, a gate line is formed at a semiconductor substrate. A spacer is formed to cover sidewalls of the gate line. Next, a protecting pattern is formed to cover ends of the gate line.

In this method, the spacer and the protecting pattern may be simultaneously formed of the same material. The material may be silicon nitride or silicon oxide.

In this method, the gate line may be formed by sequentially stacking an oxide layer and a conductive layer on a semiconductor substrate and sequentially patterning the conductive layer and the oxide layer. The conductive layer may be formed of a metal selected from a group consisting of tungsten, copper, and aluminum.

According to embodiments of the invention, since semiconductor substrate includes a protecting pattern covering ends of a gate line, the ends of the gate line are protected by the protecting pattern, thereby preventing gate electrodes from being damaged by a cleaning solution such as SC1 in a subsequent process.

Having described several exemplary embodiments of the invention, it is noted that various modifications may be made by persons skilled in the art in light of the above teachings.

It is therefore to be understood that changes may be made to the particular embodiments of the invention disclosed above that are within the scope and the spirit of the invention as defined by the following appended claims.

What is claimed is:

1. A semiconductor device comprising:

a semiconductor substrate;

a gate line crossing over the semiconductor substrate;

a protecting pattern covering ends of the gate line; and a spacer covering sidewalls of the gate line and interposed between the gate line and the protecting pattern at the ends of the gate line.

2. The device of claim 1, wherein the spacer is formed of a material chosen from the group consisting of silicon nitride and silicon oxide.

3. The semiconductor device of claim 1, wherein the protecting pattern is formed of a material chosen from the group consisting of silicon nitride and silicon oxide.

4. The semiconductor device of claim 1, wherein the gate line comprises an oxide pattern and a conductive pattern that are sequentially stacked on the semiconductor substrate.

5. The semiconductor device of claim 4, wherein the conductive pattern is formed of a metal selected from the group consisting of tungsten, copper, and aluminum.

* * * * *